US009209168B2

(12) United States Patent
Lee

(10) Patent No.: US 9,209,168 B2
(45) Date of Patent: Dec. 8, 2015

(54) CIRCUIT WITH INTER-LAYER VIAS AND INTRA-LAYER COUPLED TRANSISTORS

(71) Applicant: TAIWAN SEMICONDUCTOR MANUFACTURING COMPANY, LTD., Hsinchu (TW)

(72) Inventor: Jam-Wem Lee, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/658,613

(22) Filed: Mar. 16, 2015

(65) Prior Publication Data

US 2015/0187747 A1 Jul. 2, 2015

Related U.S. Application Data

(63) Continuation of application No. 14/108,454, filed on Dec. 17, 2013, now Pat. No. 9,041,078.

(51) Int. Cl.
| | |
|---|---|
| *H01L 27/02* | (2006.01) |
| *H01L 27/06* | (2006.01) |
| *H01L 25/11* | (2006.01) |
| *H01L 25/00* | (2006.01) |
| *H01L 27/088* | (2006.01) |
| *H01L 27/092* | (2006.01) |

(52) U.S. Cl.
CPC ............ *H01L 27/0207* (2013.01); *H01L 25/11* (2013.01); *H01L 25/50* (2013.01); *H01L 27/0251* (2013.01); *H01L 27/0255* (2013.01); *H01L 27/0292* (2013.01); *H01L 27/0688* (2013.01); *H01L 27/088* (2013.01); *H01L 27/092* (2013.01)

(58) Field of Classification Search
CPC . H01L 27/088; H01L 27/092; H01L 27/0207; H01L 27/0251; H01L 27/0255; H01L 27/0259; H01L 27/0262; H01L 27/0292
USPC ........................................................ 257/355
See application file for complete search history.

(56) References Cited

U.S. PATENT DOCUMENTS

| | | | | |
|---|---|---|---|---|
| 4,956,691 | A | * | 9/1990 | Culley et al. .................. 257/369 |
| 8,093,650 | B2 | * | 1/2012 | Georgescu et al. ........... 257/326 |
| 2012/0261768 | A1 | | 10/2012 | Houston et al. | |

* cited by examiner

*Primary Examiner* — Monica D Harrison
(74) *Attorney, Agent, or Firm* — Hauptman Ham, LLP

(57) ABSTRACT

A circuit comprises a first layer comprising a first voltage line, a first transistor coupled with the first voltage line, a second transistor coupled with the first voltage line, and a first line coupling a drain of the first transistor with a gate of the second transistor. The circuit also comprises a second layer comprising a second voltage line, a third transistor coupled with the second voltage line, a fourth transistor coupled with the second voltage line, and a second line coupling a drain of the third transistor with a gate of the fourth transistor. The circuit further comprises an inter-layer interconnect structure coupling the first transistor with the third transistor, and the second transistor with the fourth transistor.

20 Claims, 8 Drawing Sheets

CIRCUIT WITH INTER-LAYER VIAS AND INTRA-LAYER COUPLED TRANSISTORS

PRIORITY CLAIM

The present application is a continuation of U.S. application Ser. No. 14/108,454, filed Dec. 17, 2013, which is incorporated herein by reference in its entirety.

BACKGROUND

Device manufacturers are continually challenged to deliver value and convenience to consumers by, for example, providing integrated circuits that perform at optimal levels while occupying minimal space. Three-dimensional integrated circuits increase processing capabilities while reducing an overall footprint of the integrated circuit compared to a conventional two-dimensional integrated circuit having similar processing capabilities. Some three-dimensional integrated circuits, such as three-dimensional integrated circuits, include p-channel metal-oxide-semiconductor (PMOS) transistors and n-channel metal-oxide-semiconductor (NMOS) transistors. The PMOS transistors and NMOS transistors are sometimes formed on different wafers that together combine to form the three-dimensional integrated circuit.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. The drawings, incorporated herein by reference, include the following.

DETAILED DESCRIPTION

The following disclosure provides many different embodiments, or examples, for implementing different features of the invention. Specific examples of components and arrangements are described below to simplify the present disclosure. These are examples and are not intended to be limiting.

Multi-level or multi-layer three-dimensional integrated circuits are developed to satisfy the growing demand for faster processing capabilities while occupying a minimal amount of space. Inter-layer vias often provide connectivity between the various layers of a three-dimensional integrated circuit. Common multi-layer integrated circuits; however, are easily damaged by charges induced during various processes, packaging and testing. For example, an electrostatic discharge that occurs between different power supplies associated with nearby transistors in a three-dimensional integrated circuit, or power supplied to corresponding sources of nearby transistors, often damages the integrated circuit, results in a short circuit as power goes to ground, and/or causes signal noise or interference.

Figure 1:
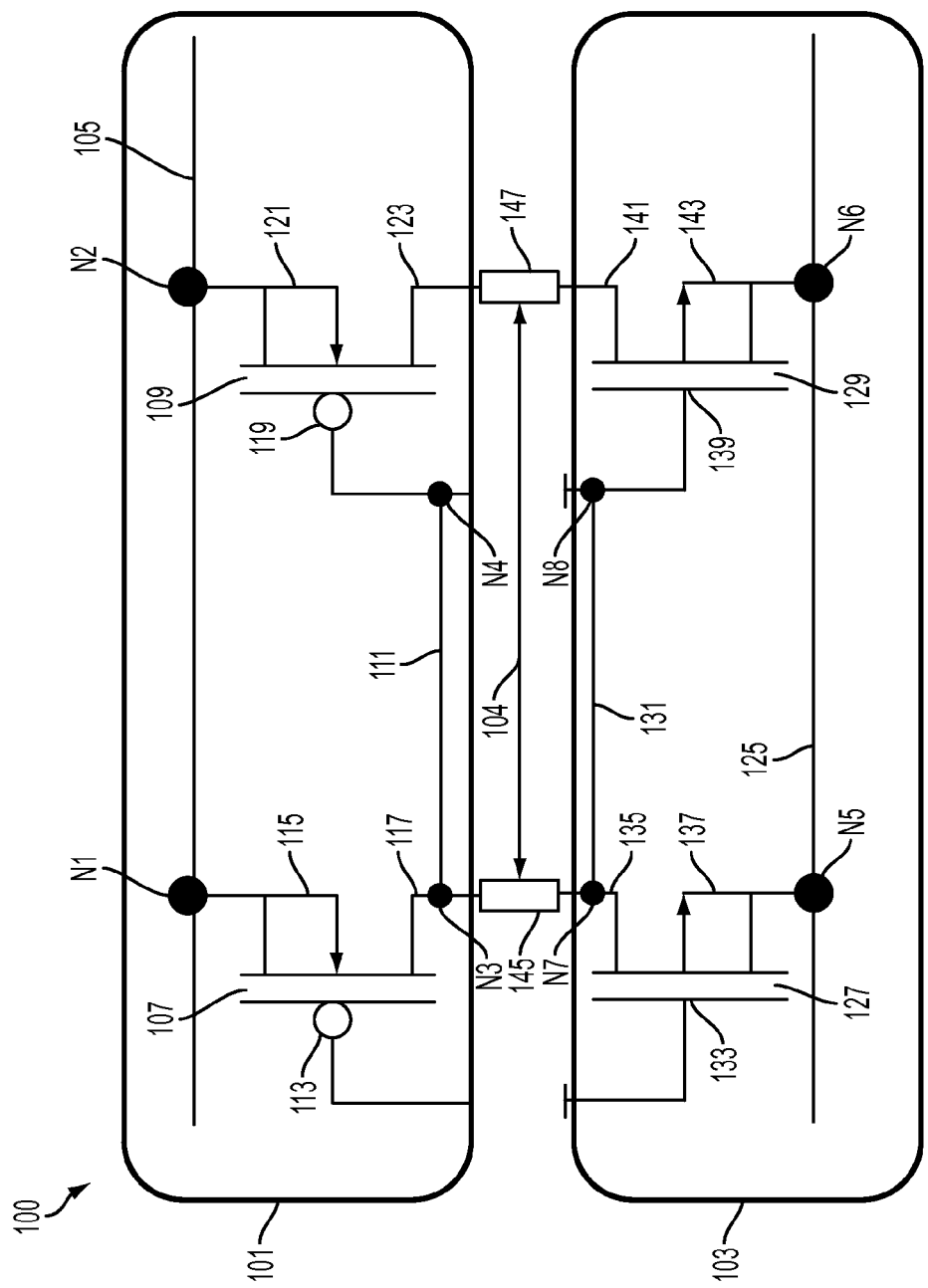
FIG. 1 is a schematic diagram of an integrated circuit, in accordance with one or more embodiments.

FIG. 1 is a schematic diagram of an integrated circuit 100, in accordance with one or more embodiments. The integrated circuit 100 employs an example application of a receiver/transmitter and inverter connection scheme that enhances a charged device model (CDM) robustness of the integrated circuit 100 and protects the integrated circuit 100 from process induced damage (PID). In some embodiments, the integrated circuit 100 is a three-dimensional integrated circuit.

The integrated circuit 100 includes a first layer 101 and a second layer 103. An inter-layer interconnect 104 connects the first layer 101 to the second layer 103. The first layer 101 comprises a power line 105, a first transistor 107, a second transistor 109, and a first line 111. The first transistor 107 has a gate 113, a source 115 and a drain 117. The source 115 of the first transistor 107 is electrically coupled to the power line 105 at a first node N1. The second transistor 109 has a gate 119, a source 121 and a drain 123. The source 121 of the second transistor 109 is electrically coupled to the power line 105 at a second node N2. The first line 111 is electrically coupled to the drain 117 of the first transistor 107 at a third node N3 and to the gate 119 of the second transistor 109 at a fourth node N4. The first line 111, accordingly, electrically couples the drain 117 of the first transistor 107 to the gate 119 of the second transistor 109. In some embodiments, the first line 111 directly couples the first transistor 107 and the second transistor 109.

The second layer 103 is separate from the first layer 101. The second layer 103 comprises a ground line 125, a third transistor 127, a fourth transistor 129, and a second line 131. The third transistor 127 has a gate 133, a drain 135 and a source 137. The source 137 of the third transistor 127 is electrically coupled to the ground line 125 at a fifth node N5. The fourth transistor 129 has a gate 139, a drain 141 and a source 143. The source 143 of the fourth transistor 129 is electrically coupled to the ground line 125 at a sixth node N6. The second line 131 is electrically coupled to the drain 135 of the third transistor 127 at a seventh node N7 and to the gate 139 of the fourth transistor 129 at an eighth node N2. The second line 131, accordingly, electrically couples the drain 135 of the third transistor 127 to the gate 139 of the fourth transistor 129. In some embodiments, the second line 131 directly couples the third transistor 127 and the fourth transistor 129.

Inter-layer interconnect 104 comprises a first inter-layer via 145 electrically coupling the first transistor 107 and the third transistor 127. The first inter-layer via 145 is electrically coupled between the third node N3 and the seventh node N7. Inter-layer interconnect 104 also comprises a second inter-layer via 147 electrically coupling the drain 123 of the second transistor 109 and the drain 141 of the fourth transistor 129.

In some embodiments, the first transistor 107 is a PMOS transistor, the second transistor 109 is a PMOS transistor, the third transistor 127 is an NMOS transistor, and the fourth transistor 129 is an NMOS transistor. In other embodiments, the first transistor 107 is an NMOS transistor, the second transistor 109 is an NMOS transistor, the third transistor 127 is a PMOS transistor, and the fourth transistor 129 is a PMOS transistor.

In some embodiments, the first layer 101 is completely isolated from the second layer 103 but for the discussed inter-layer interconnect 104 comprising one or more inter-layer vias, e.g., first inter-layer via 145 or second inter-layer via 147, or any other suitably placed inter-layer via. For example, in some embodiments, the inter-layer interconnect 104 comprises a plurality of inter-layer vias that couple a plurality of features such as various gates, sources, drains, lines, transistors, devices, or other features. But, in some embodiments, the gate of the second transistor 109 and the gate of the fourth transistor 129 are specifically isolated from a direct coupling or connection to at least partially protect the integrated circuit 100 from PID damage and enhance the CDM robustness of the integrated circuit 100.

In some embodiments, the first layer 101 comprises a substrate such as a silicon wafer, a polymer, glass, metal, other suitable material, or combination thereof and the second layer 103 comprises a substrate such as a silicon wafer, a polymer, glass, metal, other suitable material, or combination thereof. In some embodiments, the first layer 101 and the second layer 103 comprise the same materials. In other embodiments, the first layer 101 and the second layer 103 comprise different materials. In some embodiments, the first layer 101 is over the second layer 103. In other embodiments, the second layer 103 is over the first layer 101.

In some embodiments, the first line 111, the second line 131, the first inter-layer via 145 and/or the second inter-layer via 147 comprise a metal such as gold, copper, aluminum, tin, or other suitable material.

In some embodiments, though illustrated as being incorporated in the first layer 101 and the second layer 103, the power line 105 and/or the ground line 125 are positioned in one or more additional layers other than the first layer 101 and the second layer 103. In some embodiments, one or more additional inter-layer vias couple the power line 105 and/or the ground line 125 to any of the first transistor 107, the second transistor 109, the third transistor 127, the fourth transistor 129, or any other component of the integrated circuit 100 discussed herein.

Figure 2:
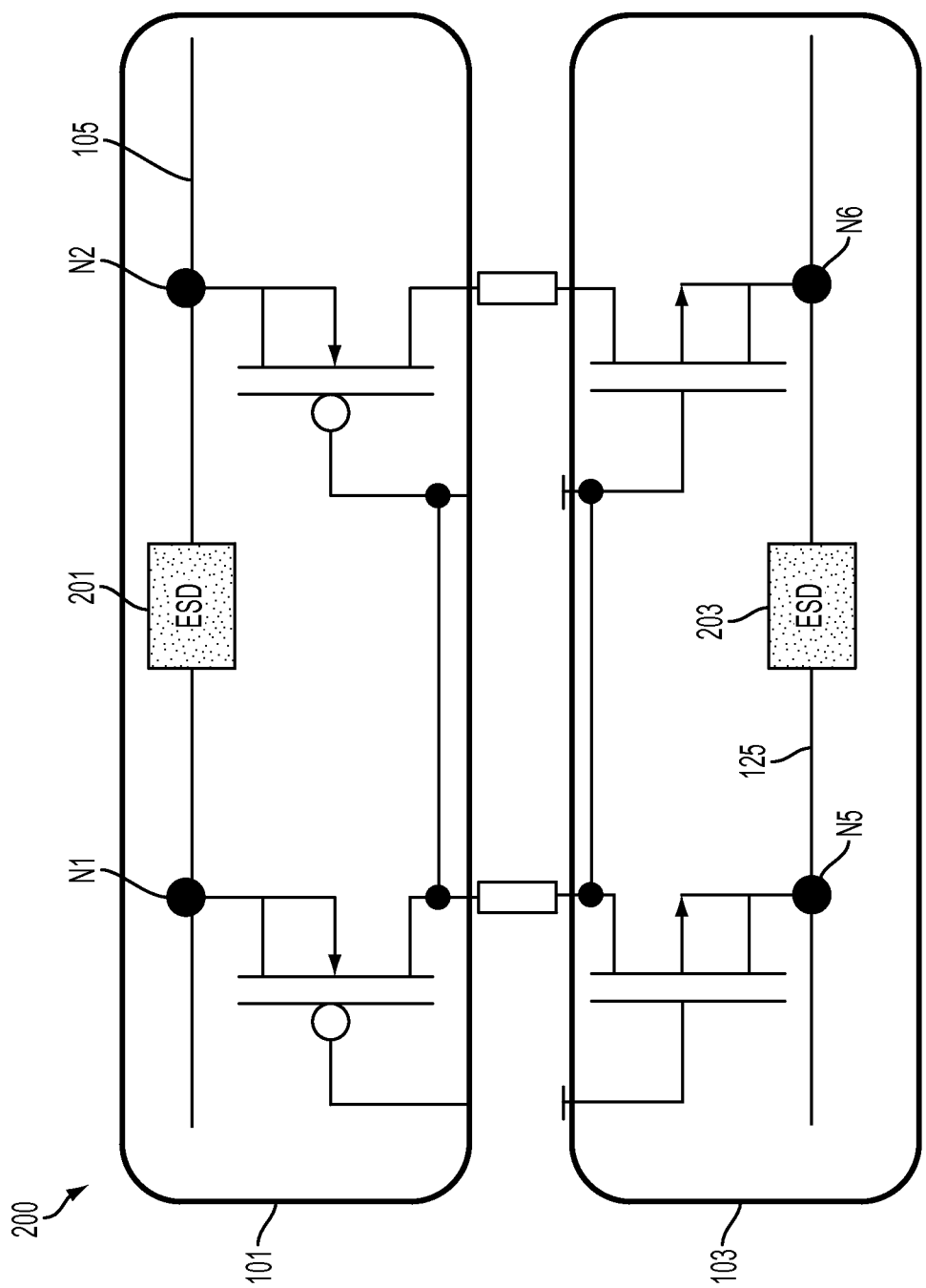
FIG. 2 is a schematic diagram of an integrated circuit, in accordance with one or more embodiments.

FIG. 2 is a schematic diagram of an integrated circuit 200, in accordance with one or more embodiments. The integrated circuit 200 illustrated in FIG. 2 includes many of the features discussed with respect to FIG. 1. In some embodiments, the first layer 101 includes a first electrostatic discharge protection device 201 electrically coupled to the power line 105 between the first node N1 and the second node N2 and/or the second layer 103 includes a second electrostatic discharge protection device 203 electrically coupled to the ground line 125 between the fifth node N5 and the sixth node N6. In some embodiments, the first electrostatic discharge protection device 201 and the second electrostatic discharge protection device 203 are electrostatic discharge protection diodes. According to one or more embodiments, the first electrostatic discharge protection device 201 and the second electrostatic discharge protection device 203 are another type of suitable electrostatic discharge protection device. In some embodiments, the first electrostatic discharge protection device 201 and the second electrostatic discharge protection device 203 are the same type of electrostatic discharge protection devices. In other embodiments, the first electrostatic discharge protection device 201 and the second electrostatic discharge protection device 203 are different types of electrostatic discharge protection devices.

Figure 3:
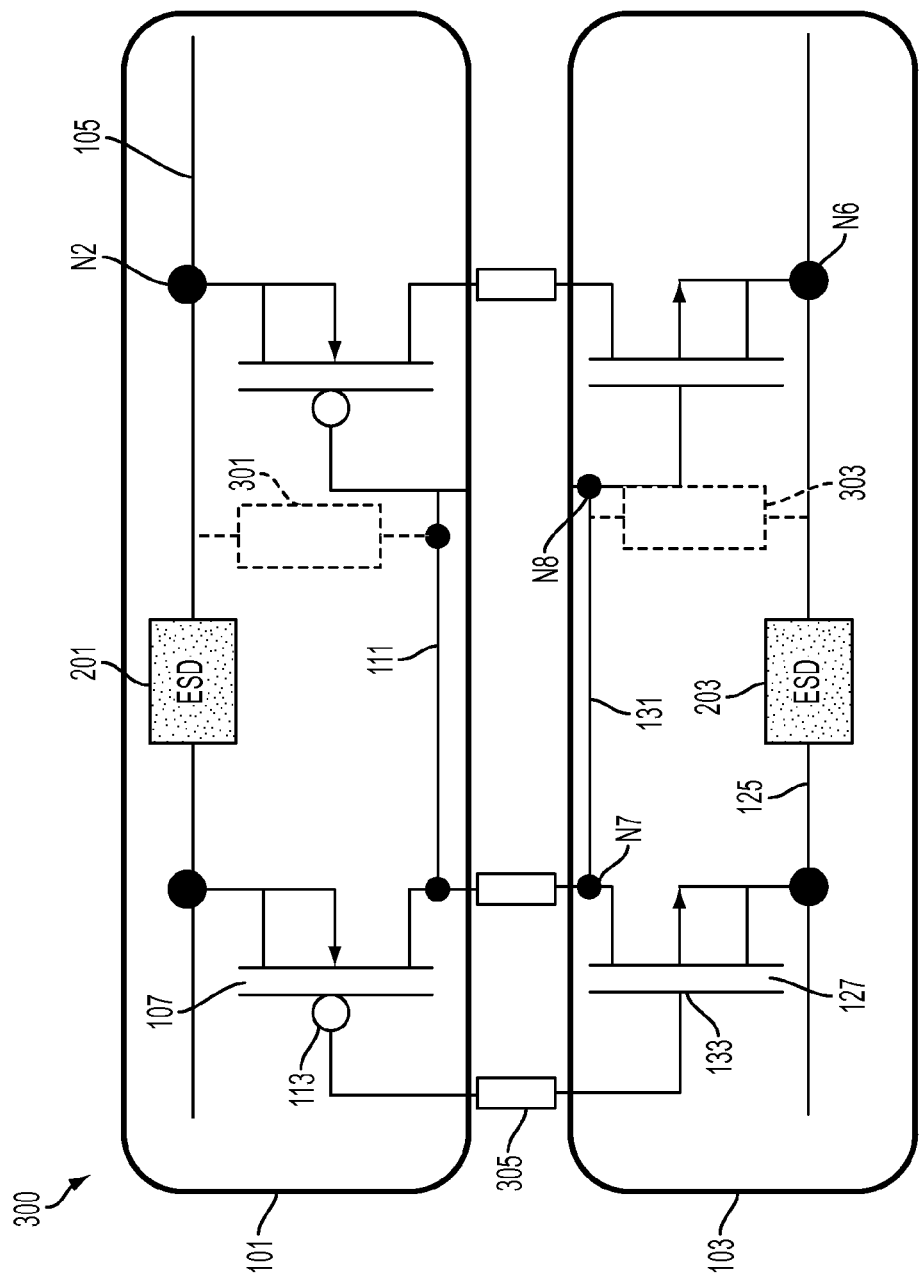
FIG. 3 is a schematic diagram of an integrated circuit, in accordance with one or more embodiments.

FIG. 3 is a schematic diagram of an integrated circuit 300, in accordance with one or more embodiments. The integrated circuit 300 illustrated in FIG. 3 includes many of the features discussed with respect to FIG. 2. In some embodiments, the first layer 101 includes a third electrostatic discharge protection device 301 electrically coupled to the power line 105 at a position between the first electrostatic discharge protection device 201 and the second node N2, and to the first line 111 at a position between the third node N3 and the fourth node N4, and/or the second layer 103 includes a fourth electrostatic discharge protection device 303 electrically coupled to the ground line 125 at a position between the second electrostatic discharge protection device 203 and the sixth node N6, and to the second line 131 at a position between the seventh node N7 and the eighth node N8. In some embodiments, the integrated circuit 300 optionally includes a third inter-layer via 305 electrically coupling the gate 113 of the first transistor 107 and the gate 133 of the third transistor 127. In some embodiments, the third inter-layer via 305 comprises a metal such as gold, copper, aluminum, tin, or other suitable material.

In some embodiments, the third electrostatic discharge protection device 301 and the fourth electrostatic discharge protection device 303 are electrostatic discharge protection diodes. According to one or more embodiments, the third electrostatic discharge protection device 301 and the fourth electrostatic discharge protection device 303 are another type of suitable electrostatic discharge protection device. In some embodiments, the third electrostatic discharge protection device 301 and the fourth electrostatic discharge protection device 303 are the same type of electrostatic discharge protection devices. In other embodiments, the third electrostatic discharge protection device 301 and the fourth electrostatic discharge protection device 303 are different types of electrostatic discharge protection devices.

Figure 4:
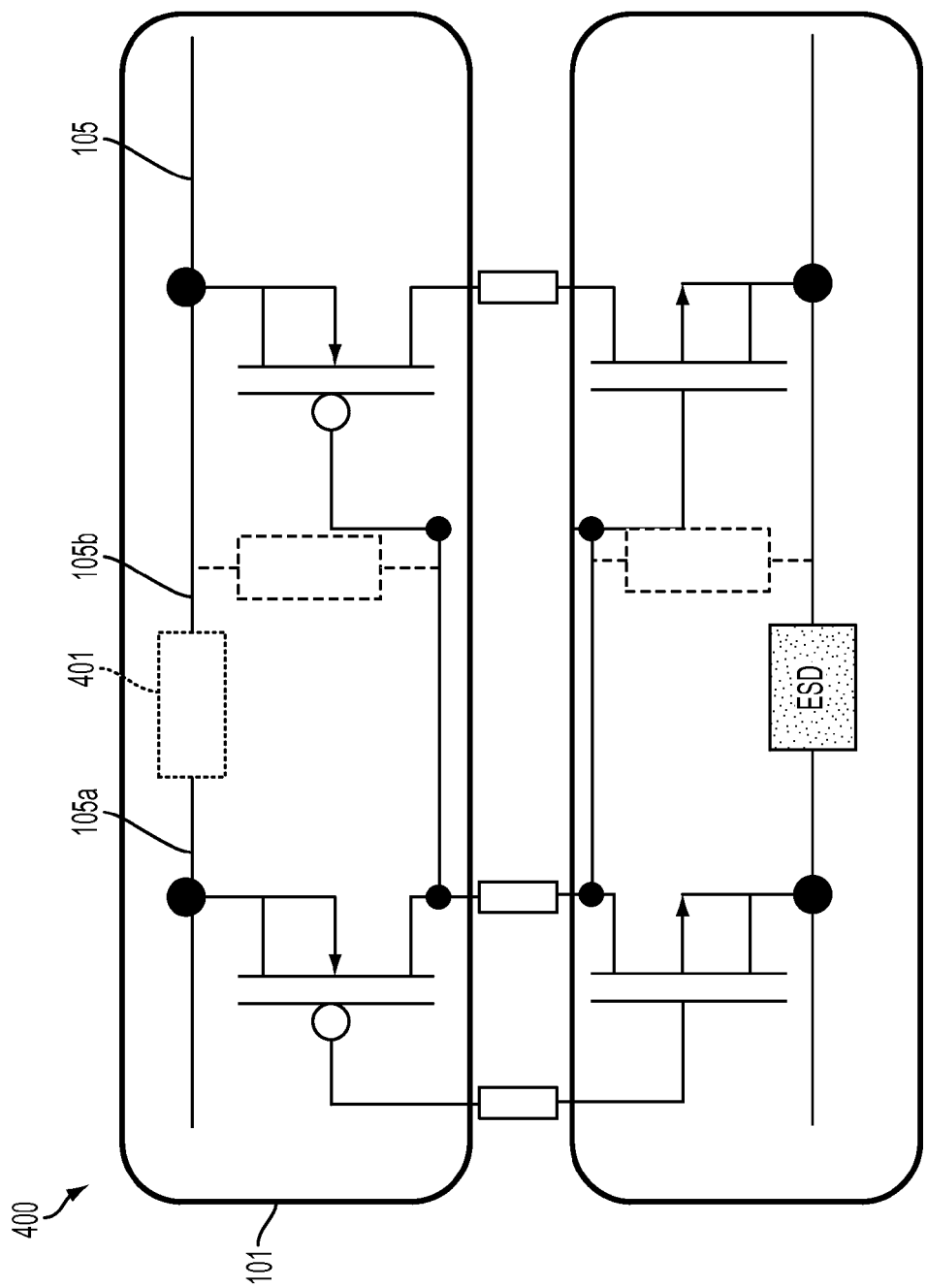
FIG. 4 is a schematic diagram of an integrated circuit, in accordance with one or more embodiments.

FIG. 4 is a schematic diagram of an integrated circuit 400, in accordance with one or more embodiments. The integrated circuit 400 illustrated in FIG. 4 includes many of the features discussed with respect to FIG. 3; however, the integrated circuit 400 in this example embodiment lacks the above-discussed first electrostatic discharge protection device 201. Instead, the power line 105 is divided into a first portion 105a and a second portion 105b. The first layer 101 comprises an isolation region 401 that separates the first portion 105a from the second portion 105b of the power line 105.

Figure 5:
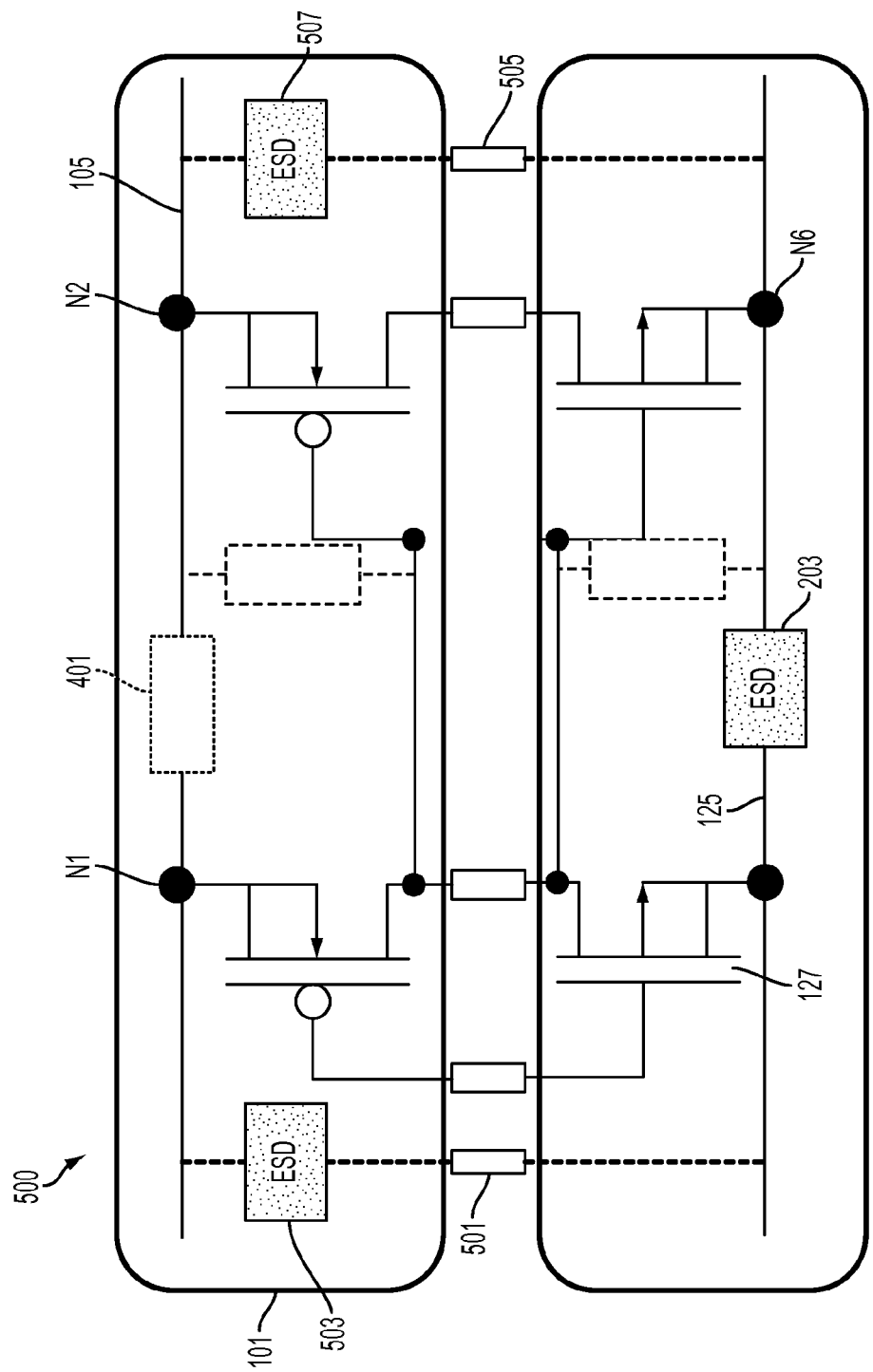
FIG. 5 is a schematic diagram of an integrated circuit, in accordance with one or more embodiments.

FIG. 5 is a schematic diagram of an integrated circuit 500, in accordance with one or more embodiments. The integrated circuit 500 illustrated in FIG. 5 includes many of the features discussed with respect to FIG. 4. In some embodiments, the integrated circuit 500 comprises a fourth inter-layer via 501 that electrically couples the power line 105 and the ground line 125. The integrated circuit 500 includes another electrostatic discharge protection device 503 in the first layer 101 electrically coupled to the fourth inter-layer via 501 between the power line 105 and the ground line 125. In some embodiments, the integrated circuit 500 includes a fifth inter-layer via 505 that electrically couples the power line 105 and the ground line 125. The integrated circuit 500 includes an additional electrostatic discharge protection device 507 in the first layer 101 electrically coupled to the fifth inter-layer via 505 between the power line 105 and the ground line 125.

In some embodiments, the fourth inter-layer via 501 is coupled to the power line 105 on a first node N1 side of the isolation region 401, the fifth inter-layer via 505 is coupled to the power line 105 on a second node N2 side of the isolation region 401, the fourth inter-layer via 501 is coupled to the ground line 125 on a fifth node N5 side of the second electrostatic discharge protection device 203, and the fifth inter-layer via 505 is coupled to the ground line 125 on a sixth node N6 side of the second electrostatic discharge protection device 203.

In some embodiments, fourth inter-layer via 501 and the fifth inter-layer via 505 comprise a metal such as gold, copper, aluminum, tin, or other suitable material.

In some embodiments, electrostatic discharge protection device 503 and the additional electrostatic discharge protection device 507 are electrostatic discharge protection diodes. According to one or more embodiments, electrostatic discharge protection device 503 and the additional electrostatic discharge protection device 507 are another type of suitable electrostatic discharge protection device. In some embodiments, electrostatic discharge protection device 503 and the additional electrostatic discharge protection device 507 are the same type of electrostatic discharge protection devices. In other embodiments, electrostatic discharge protection device 503 and the additional electrostatic discharge protection device 507 are different types of electrostatic discharge protection devices.

Figure 6:
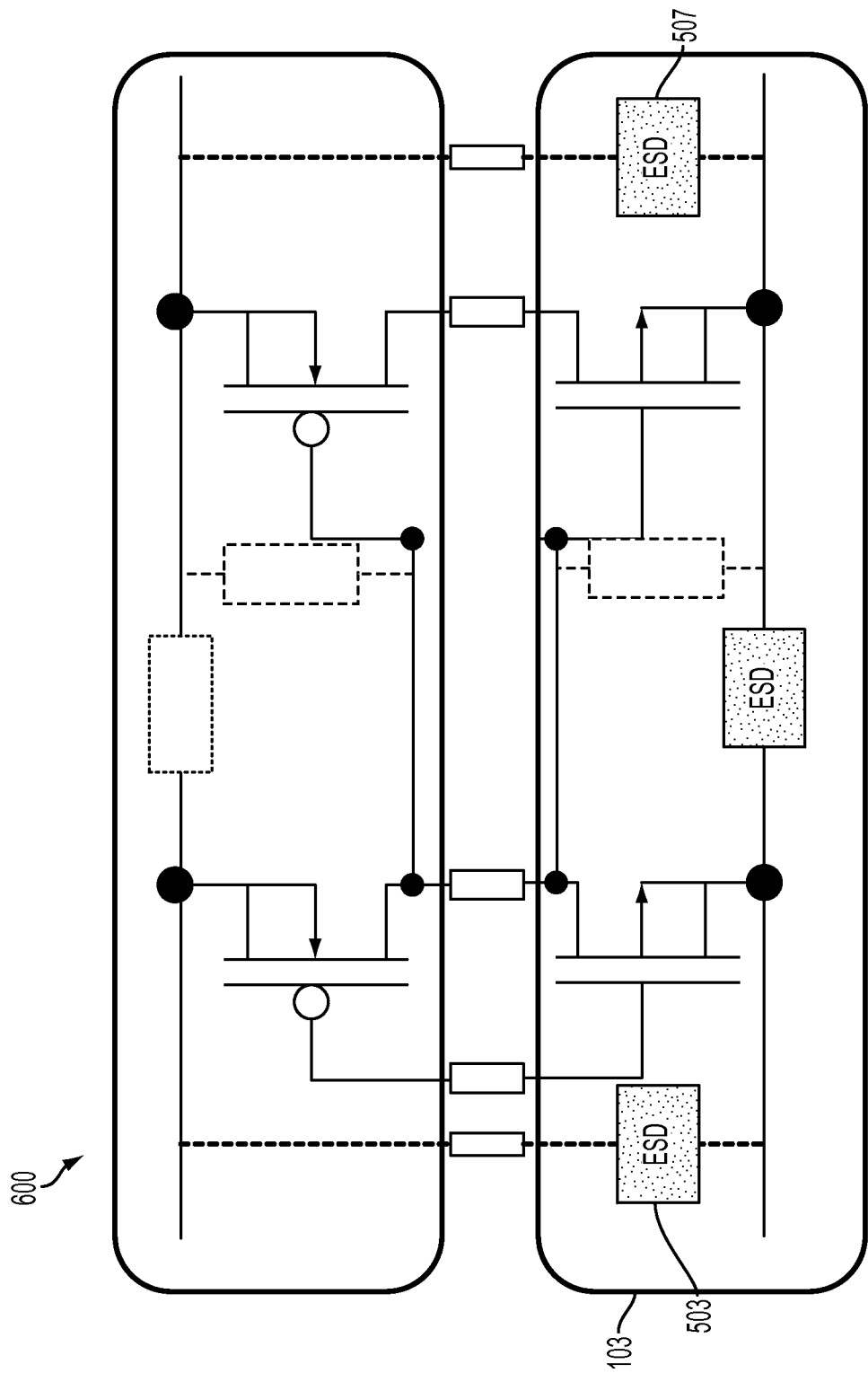
FIG. 6 is a schematic diagram of an integrated circuit, in accordance with one or more embodiments.

FIG. 6 is a schematic diagram of an integrated circuit 600, in accordance with one or more embodiments. The integrated circuit 600 illustrated in FIG. 6 includes many of the features discussed with respect to FIG. 5. In some embodiments; however, electrostatic discharge protection device 503 and the additional electrostatic discharge protection device 507 are in the second layer 103.

Figure 7:
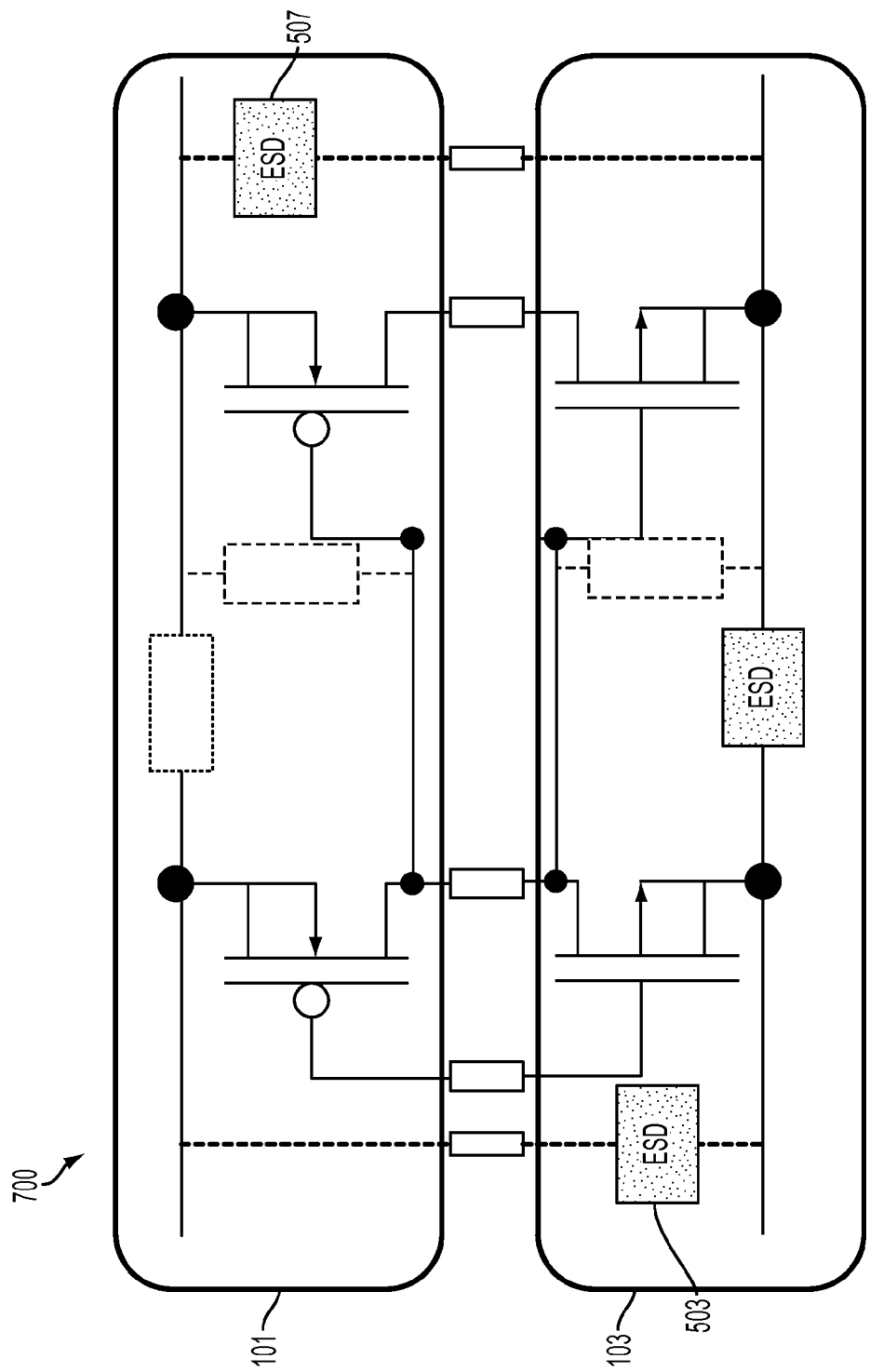
FIG. 7 is a schematic diagram of an integrated circuit, in accordance with one or more embodiments.

FIG. 7 is a schematic diagram of an integrated circuit 700, in accordance with one or more embodiments. The integrated circuit 700 illustrated in FIG. 7 includes the features discussed with respect to FIG. 5. In some embodiments; however, one of the electrostatic discharge protection device 503 or the additional electrostatic discharge protection device 507 is in the second layer 103 and the other of the electrostatic discharge protection device 503 or the additional electrostatic discharge protection device 507 is in the second layer 103.

Figure 8:
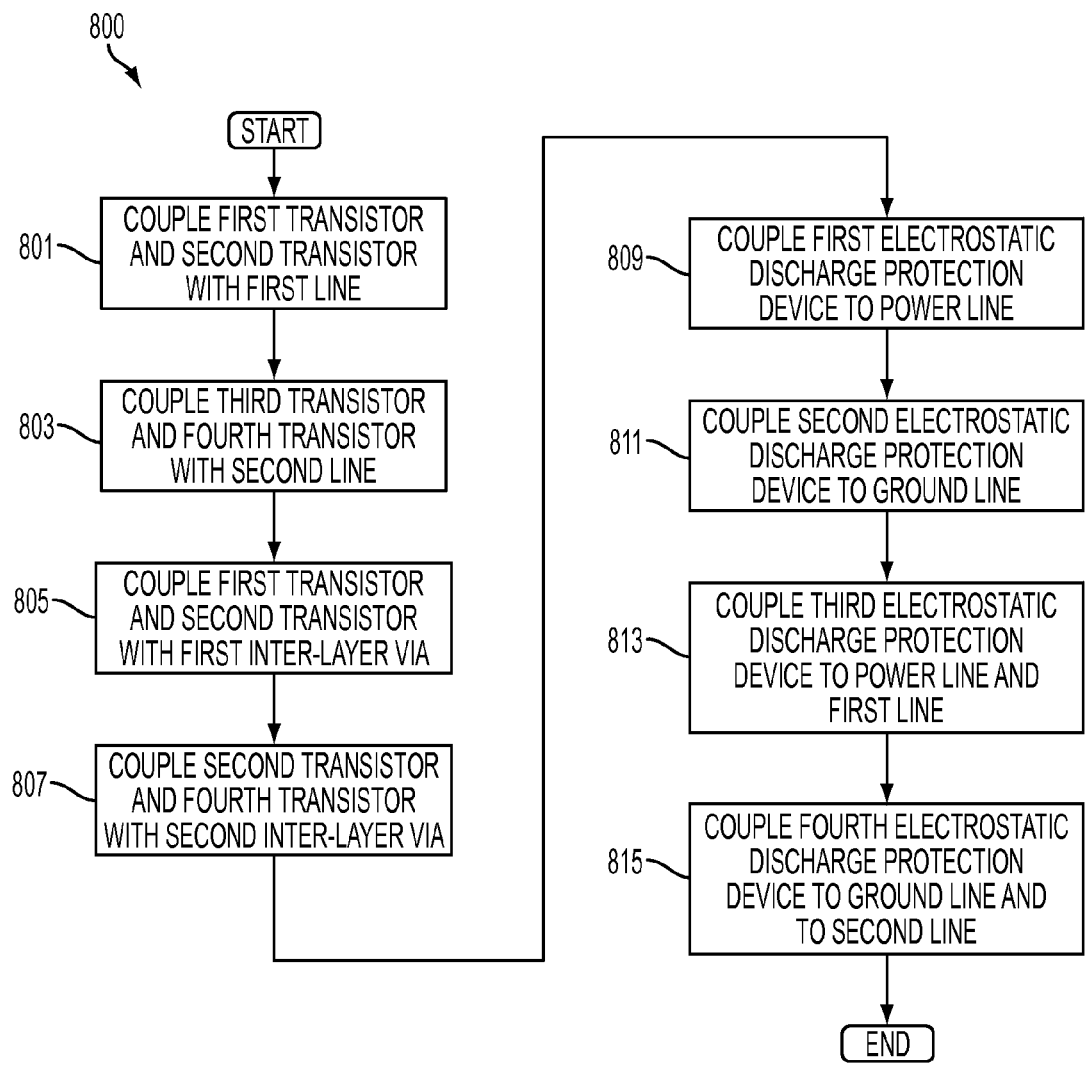
FIG. 8 is a flowchart of a process associated with intra-layer transistor coupling, in accordance with one or more embodiments.

FIG. 8 is a flowchart of a process 800 associated with intra-layer transistor coupling, in accordance with one or more embodiments. The process 800 begins with step 801 in which a first transistor, e.g., first transistor 107 (FIG. 1), is coupled to a second transistor, e.g., second transistor 109, with a first line, e.g., line 111, in a first layer, e.g., first layer 101, of an integrated circuit, e.g., integrated circuit 100. In some embodiments, the first layer comprises a power line, e.g., power line 105, the first transistor, the second transistor, and the first line. The first transistor has a gate, a source and a drain. The source of the first transistor is coupled to the power line. The second transistor has a gate, a source and a drain. The source of the second transistor is also coupled to the power line.

Then, in step 803, a third transistor is coupled to a fourth transistor, e.g., fourth transistor 127, with a second line, e.g., second line 121, in a second layer, e.g., second layer 103, of the integrated circuit. In some embodiments, the second layer comprises a ground line, e.g., ground line 125, the third transistor, the fourth transistor, and the ground line. The third transistor has a gate, a source and a drain. The source of the third transistor is coupled to the ground line. The fourth transistor has a gate, a source and a drain. The source of the fourth transistor is coupled to the ground line.

In step 805, the drain of the first transistor is coupled to the drain of the third transistor with a first inter-layer via of an inter-layer interconnect, e.g., inter-layer interconnect 104. In step 807, the drain of the second transistor is coupled to the drain of the fourth transistor with a second inter-layer via of the inter-layer interconnect. In step 809, a first electrostatic discharge protection device, e.g., electrostatic discharge protection device 201 (FIG. 2) is coupled to the power line. In step 811, a second electrostatic discharge protection device, e.g., electrostatic discharge protection device 203, is coupled to the ground line. In step 813, a third electrostatic discharge protection device, e.g., electrostatic protection discharge protection device 301 (FIG. 3), is coupled to the power line and to the first line. In step 815, a fourth electrostatic discharge protection device, e.g., electrostatic discharge protection device 303, is coupled to the ground line and to the second line.

An aspect of this description relates to a circuit that comprises a first layer comprising a first voltage line, a first transistor coupled with the first voltage line, a second transistor coupled with the first voltage line, and a first line coupling a drain of the first transistor with a gate of the second transistor. The circuit also comprises a second layer comprising a second voltage line, a third transistor coupled with the second voltage line, a fourth transistor coupled with the second voltage line, and a second line coupling a drain of the third transistor with a gate of the fourth transistor. The second line is separate from the first line. The circuit further comprises an inter-layer interconnect structure coupling the first transistor with the third transistor, and the second transistor with the fourth transistor.

Another aspect of this description relates to a three-dimensional integrated circuit that comprising a first circuit on a first substrate. The first circuit comprises a first PMOS transistor, a second PMOS transistor, and a first line coupling a drain of the first PMOS transistor with a gate of the second PMOS transistor. The three-dimensional integrated circuit also comprises a second circuit on a second substrate. The second circuit comprises a first NMOS transistor, a second NMOS transistor, and a second line coupling a drain of the first NMOS transistor with a gate of the second NMOS transistor. The three-dimensional integrated circuit further comprises a first inter-layer via coupling the drain of the first PMOS transistor with the drain of first NMOS transistor. The three-dimensional integrated circuit additionally comprises a second inter-layer via coupling a drain of the second PMOS transistor with a drain of the second NMOS transistor. A most direct electrical connection between the gate of the second PMOS transistor and the gate of the second NMOS transistor is through the first inter-layer via.

A further aspect of this description is related to a circuit that comprises a first layer. The first layer comprises a first voltage line, a first transistor coupled with the first voltage line, a second transistor coupled with the first voltage line, and a first line coupling a drain of the first transistor with a gate of the second transistor. The circuit also comprises a second layer. The second layer comprises a second voltage line, a third transistor coupled with the second voltage line, a fourth transistor coupled with the second voltage line, and a second line coupling a drain of the third transistor with a gate of the fourth transistor. The circuit further comprises an inter-layer interconnect structure. The inter-layer interconnect structure comprises a first inter-layer via coupling the drain of the first transistor with the drain of the third transistor, a second inter-layer via coupling a drain of the second transistor with a drain of the fourth transistor, and a third inter-layer via coupling a gate of the first transistor with a gate of the third transistor. The gate of the second transistor is directly electrically coupled with the gate of the fourth transistor only by way of a path comprising the first inter-layer via.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A circuit comprising:
   a first layer comprising:
      a first voltage line;
      a first transistor coupled with the first voltage line;
      a second transistor coupled with the first voltage line; and
      a first line coupling a drain of the first transistor with a gate of the second transistor;
   a second layer comprising:
      a second voltage line;
      a third transistor coupled with the second voltage line;
      a fourth transistor coupled with the second voltage line; and
      a second line coupling a drain of the third transistor with a gate of the fourth transistor, the second line being separate from the first line; and
   an inter-layer interconnect structure coupling the first transistor with the third transistor, and the second transistor with the fourth transistor.

2. The circuit of claim 1, wherein the first transistor is a p-type metal oxide semiconductor (PMOS) transistor, the second transistor is a PMOS transistor, the third transistor is an n-type metal oxide semiconductor (NMOS) transistor, and the fourth transistor is an NMOS transistor.

3. The circuit of claim 1, wherein the first transistor is an NMOS transistor, the second transistor is an NMOS transistor, the third transistor is a PMOS transistor, and the fourth transistor is a PMOS transistor.

4. The circuit of claim 1, wherein the first layer comprises a first wafer and the second layer comprises a second wafer.

5. The circuit of claim 1, wherein the inter-layer interconnect structure comprises:
   a first inter-layer via coupling the drain of the first transistor with the drain of the third transistor; and
   a second inter-layer via coupling a drain of the second transistor with a drain of the fourth transistor.

6. The circuit of claim 5, further comprising:
   a first electrostatic discharge protection device coupled to the first voltage line; and
   a second electrostatic discharge protection device coupled to the second voltage line.

7. The circuit of claim 6, further comprising:
   a third electrostatic discharge protection device coupled to the first voltage line and to the first line; and
   a fourth electrostatic discharge protection device coupled to the second voltage line and to the second line.

8. The circuit of claim 5, wherein the inter-layer interconnect structure further comprises:
   a third inter-layer via coupling a gate of the first transistor with a gate of the third transistor.

9. The circuit of claim 8, wherein the first voltage line is discontinuous, there being an isolation region in the first layer separating the first voltage line into a first portion and a second portion, the first portion being on a first transistor side of the isolation region and the second portion being on a second transistor side of the isolation region, and the circuit further comprises:

a first electrostatic discharge protection device coupled to the second voltage line;
a second electrostatic discharge protection device coupled to the second portion of the first voltage line and to the first line; and
a third electrostatic discharge protection device coupled to the second voltage line and to the second line.

10. The circuit of claim 9, wherein the inter-layer interconnect structure further comprises:
   a fourth inter-layer via coupling the first voltage line with the second voltage line; and
   a fifth inter-layer via coupling the first voltage line with the second voltage line, and the circuit further comprises:
   a fourth electrostatic discharge protection device coupled to the fourth inter-layer via between the first voltage line and the second voltage line; and
   a fifth electrostatic discharge protection device coupled to the fifth inter-layer via between the first voltage line and the second voltage line.

11. The circuit of claim 10, wherein the fourth inter-layer via is coupled to the first portion of the first voltage line, the fifth inter-layer via is coupled to the second portion of the first voltage line, the fourth inter-layer via is coupled to the second voltage line on a first transistor side of the first electrostatic discharge protection device, and the fifth inter-layer via is coupled to the second voltage line on a second transistor side of the first electrostatic discharge protection device.

12. The circuit of claim 10, wherein the fourth electrostatic discharge protection device and the fifth electrostatic discharge protection device are in the first layer.

13. The circuit of claim 10, wherein the fourth electrostatic discharge protection device and the fifth electrostatic discharge protection device are in the second layer.

14. The circuit of claim 10, wherein the fourth electrostatic discharge protection device is in one of the first layer or the second layer and the fifth electrostatic discharge protection device is in the other of the first layer or the second layer.

15. The circuit of claim 8, wherein
   the first voltage line is discontinuous, there being an isolation region in the first layer separating the first voltage line into a first portion and a second portion, the first portion being on a first transistor side of the isolation region and the second portion being on a second transistor side of the isolation region,
   the inter-layer interconnect structure further comprises:
      a fourth inter-layer via coupling the first voltage line with the second voltage line; and
      a fifth inter-layer via coupling the first voltage line with the second voltage line, and the circuit further comprises:
      a first electrostatic discharge protection device coupled to the second voltage line;
      a second electrostatic discharge protection device coupled to the fourth inter-layer via between the first voltage line and the second voltage line; and
      a third electrostatic discharge protection device coupled to the fifth inter-layer via between the first voltage line and the second voltage line.

16. A three-dimensional integrated circuit comprising:
   a first circuit on a first substrate, the first circuit comprising:
      a first p-type metal oxide semiconductor (PMOS) transistor;
      a second PMOS transistor; and
      a first line coupling a drain of the first PMOS transistor with a gate of the second PMOS transistor;
   a second circuit on a second substrate, the second circuit comprising:

a first n-type metal oxide semiconductor (NMOS) transistor;
a second NMOS transistor; and
a second line coupling a drain of the first NMOS transistor with a gate of the second NMOS transistor;
a first inter-layer via coupling the drain of the first PMOS transistor with the drain of first NMOS transistor; and
a second inter-layer via coupling a drain of the second PMOS transistor with a drain of the second NMOS transistor,
wherein a most direct electrical connection between the gate of the second PMOS transistor and the gate of the second NMOS transistor is through the first inter-layer via.

17. The three-dimensional integrated circuit of claim 16, further comprising:
a first voltage line coupled with the first PMOS transistor and with the second PMOS transistor;
a second voltage line coupled with the first NMOS transistor and with the second NMOS transistor;
a first electrostatic discharge protection device coupled to the first voltage line between the first PMOS transistor and the second PMOS transistor; and
a second electrostatic discharge protection device coupled to the second voltage line between the first NMOS transistor and the second NMOS transistor.

18. The three-dimensional integrated circuit of claim 17, further comprising:
a third electrostatic discharge protection device coupled to the first voltage line between the first PMOS transistor and the second PMOS transistor, and to the first line; and
a fourth electrostatic discharge protection device coupled to the second voltage line between the first NMOS transistor and the second NMOS transistor, and to the second line.

19. The three-dimensional integrated circuit of claim 17, further comprising:
a third inter-layer via coupling a gate of the first PMOS transistor with a gate of the first NMOS transistor.

20. A circuit comprising:
a first layer comprising:
a first voltage line;
a first transistor coupled with the first voltage line;
a second transistor coupled with the first voltage line; and
a first line coupling a drain of the first transistor with a gate of the second transistor;
a second layer comprising:
a second voltage line;
a third transistor coupled with the second voltage line;
a fourth transistor coupled with the second voltage line; and
a second line coupling a drain of the third transistor with a gate of the fourth transistor; and
an inter-layer interconnect structure comprising:
a first inter-layer via coupling the drain of the first transistor with the drain of the third transistor; and
a second inter-layer via coupling a drain of the second transistor with a drain of the fourth transistor; and
a third inter-layer via coupling a gate of the first transistor with a gate of the third transistor,
wherein the gate of the second transistor is directly electrically coupled with the gate of the fourth transistor only by way of a path comprising the first inter-layer via.

\* \* \* \* \*